(12) United States Patent
Xu et al.

(10) Patent No.: US 12,538,413 B2
(45) Date of Patent: Jan. 27, 2026

(54) WIRING SUBSTRATES AND ELECTRONIC APPARATUSES

(71) Applicants: Hefei BOE Ruisheng Technology Co., Ltd., Anhui (CN); BOE Technology Group Co., Ltd., Beijing (CN)

(72) Inventors: Jiawei Xu, Beijing (CN); Zouming Xu, Beijing (CN); Xintao Wu, Beijing (CN); Yajun Ma, Beijing (CN)

(73) Assignees: Hefei BOE Ruisheng Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 316 days.

(21) Appl. No.: 18/029,621

(22) PCT Filed: May 23, 2022

(86) PCT No.: PCT/CN2022/094526
§ 371 (c)(1),
(2) Date: Mar. 30, 2023

(87) PCT Pub. No.: WO2023/225813
PCT Pub. Date: Nov. 30, 2023

(65) Prior Publication Data
US 2025/0056710 A1    Feb. 13, 2025

(51) Int. Cl.
*H05K 1/02* (2006.01)
*H01L 23/538* (2006.01)
(Continued)

(52) U.S. Cl.
CPC ....... *H05K 1/0219* (2013.01); *H01L 23/5383* (2013.01); *H05K 1/0274* (2013.01);
(Continued)

(58) Field of Classification Search
None
See application file for complete search history.

(56) References Cited

U.S. PATENT DOCUMENTS 5,671,026 A * 9/1997 Shiraki ............. G02F 1/136204
349/40
8,952,921 B2 * 2/2015 Huang ................. G06F 3/0446
345/174

(Continued)

FOREIGN PATENT DOCUMENTS

CN    102856280 A    1/2013
CN    103792710 A    5/2014
(Continued)

OTHER PUBLICATIONS

PCT/CN2022/094526 international search report.

*Primary Examiner* — Ishwarbhai B Patel
(74) *Attorney, Agent, or Firm* — IPro, PLLC

(57) ABSTRACT

The present disclosure provides a wiring substrate and an electronic apparatus. The wiring substrate includes a substrate and a shielding signal line disposed on the substrate. The substrate includes a functional region; the functional region is provided with a plurality of pad groups; the plurality of pad groups are distributed in an array along a first direction and a second direction respectively, and the second direction intersects with the first direction. The shielding signal line includes a first portion surrounding all pad groups and second portions connected with the first portion, and the second portions are located between two adjacent pad groups along the second direction. The electronic apparatus includes the wiring substrate and an electronic element connected with the pad groups.

20 Claims, 3 Drawing Sheets

(51) Int. Cl.
    *H05K 1/11*        (2006.01)
    *H05K 1/18*        (2006.01)
    *H01L 25/16*      (2023.01)

(52) U.S. Cl.
    CPC ............ *H05K 1/111* (2013.01); *H01L 25/167* (2013.01); *H05K 1/0224* (2013.01); *H05K 1/11* (2013.01); *H05K 1/18* (2013.01)

(56) References Cited

U.S. PATENT DOCUMENTS

| | | | |
|---|---|---|---|
| 2014/0120795 A1 | 5/2014 | Kim et al. | |
| 2018/0122298 A1* | 5/2018 | Lee | H01L 25/167 |
| 2020/0285330 A1* | 9/2020 | Xu | G06F 3/0445 |
| 2022/0104348 A1 | 3/2022 | Wang et al. | |

FOREIGN PATENT DOCUMENTS

| | | |
|---|---|---|
| CN | 104615322 A | 5/2015 |
| CN | 110890873 A | 3/2020 |
| CN | 114333615 A | 4/2022 |

\* cited by examiner

WIRING SUBSTRATES AND ELECTRONIC APPARATUSES

CROSS-REFERENCE TO RELATED APPLICATIONS

This application is a US national stage of international PCT Application No. PCT/CN2022/094526, filed on May 23, 2022, the entire contents of which are incorporated herein by reference.

TECHNICAL FIELD

The present disclosure relates to the field of display technologies, and in particular to a wiring substrate and an electronic apparatus.

BACKGROUND

Small-size light-emitting diodes, for example, Mini LED and Micro LED, have a rough size of less than 500 μm. Due to its advantages such as smaller size, ultrahigh brightness and long service life, its use is greatly increased in the display field.

SUMMARY

According to a first aspect of embodiments of the present disclosure, there is provided a wiring substrate. The wiring substrate includes a substrate and a shielding signal line disposed on the substrate.

The substrate includes a functional region; the functional region is provided with a plurality of pad groups: the plurality of pad groups are distributed in an array along a first direction and a second direction respectively, and the second direction intersects with the first direction.

The shielding signal line includes a first portion surrounding all pad groups and second portions connected with the first portion, and the second portions are located between two adjacent pad groups along the second direction.

In an embodiment, the wiring substrate further includes a bonding region at a side of the functional region, and the second portions are located between two pad groups adjacent to each other along the second direction and farthest from the bonding region in a plurality of pad groups arranged along the first direction.

In an embodiment, the first portion and the second portions are formed into an integral structure.

In an embodiment, a line width of the first portion is less than a size of the second portions along the first direction.

In an embodiment, the wiring substrate further includes an insulation layer located at a side of the shielding signal line away from the substrate, the insulation layer is provided with a plurality of first holes, and an orthographic projection of one second portion on the substrate covers an orthographic projection of at least one first hole on the substrate.

In an embodiment, the orthographic projection of one second portion on the substrate covers an orthographic projection of at least two first holes on the substrate, and the at least two first holes are arranged in a spacing along the first direction.

In an embodiment, each of the pad groups includes at least two sub-pads: the insulation layer is further provided with a plurality of second holes, and one second hole exposes one sub-pad: a total area of the first holes corresponding to one second portion is greater than a total area of the second holes corresponding to one pad group adjacent to the second portion.

In an embodiment, the shielding signal line further includes third portions connected with the first portion:
the third portions are disposed at a side, not adjacent to other pad groups along the second direction, of the pad groups at borders and corners of the functional region.

In an embodiment, the first portion and the third portions are formed into an integral structure.

In an embodiment, the line width of the first portion is less than a size of the third portions along the first direction; and/or, the size of the third portions along the second direction is less than the size of the second portions along the second direction.

In an embodiment, the wiring substrate further includes an insulation layer located at a side of the shielding signal line away from the substrate. The insulation layer is provided with a plurality of first holes, and an orthographic projection of one third portion on the substrate covers an orthographic projection of at least one first hole on the substrate.

In an embodiment, the orthographic projection of one third portion on the substrate covers an orthographic projection of at least two first holes on the substrate; and the at least two first holes are arranged in a spacing along the first direction.

In an embodiment, each of the pad groups includes at least two sub-pads; and the insulation layer is further provided with a plurality of second holes, and one second hole exposes one sub-pad:
a total area of the first holes corresponding to one third portion is greater than a total area of the second holes corresponding to one pad group adjacent to the third portion.

In an embodiment, the wiring substrate further includes a bonding region located at a side of the functional region: in a plurality of second holes corresponding to the pad groups farthest from the bonding region in a plurality of pad groups arranged along the first direction, a distance from the second hole closest to the bonding region to the bonding region is referred to as a first distance, a distance from an edge of the second portions facing toward the bonding region to the bonding region is referred to as a second distance, and a distance from an edge of the third portions facing toward the bonding region to the bonding region is referred to as a third distance:
the second distance is greater than or equal to the first distance; and/or the third distance is greater than or equal to the first distance.

In an embodiment, the insulation layer includes an inorganic layer.

In an embodiment, the wiring substrate further includes a reflective material layer located at a side of the insulation layer away from the substrate, and the reflective material layer covers the first holes.

In an embodiment, the wiring substrate further includes a plurality of signal lines disposed on the substrate, and a bonding region located at a side of the functional region:
in the plurality of signal lines, at least one signal line is located at a side of the second portions facing toward the bonding region: along the first direction, a distance between the second portions and the signal line at a side of the second portions facing toward the bonding region is greater than or equal to 200 microns;
and/or, in the plurality of signal lines, at least one signal line is located at a side of the third portions facing toward the bonding region: along the first direction, a distance between the third portions and the signal line at a side of the third portions facing toward the bonding region is greater than or equal to 200 microns.

In an embodiment, the pad groups include a plurality of sub-pads, the wiring substrate further includes connection wires, and at least two sub-pads in a same pad group are connected by the connection wire: along the second direction, a minimum distance between the second portions and the adjacent connection wires is greater than or equal to 200 microns; and/or, along the second direction, a minimum distance between the third portions and the adjacent connection wires is greater than or equal to 200 microns.

In an embodiment, the pad groups include a plurality of sub-pads, and the plurality of sub-pads and the shielding signal line are disposed in a same layer.

According to a second aspect of embodiments of the present disclosure, there is provided an electronic apparatus. The electronic apparatus includes the above wiring substrate and an electronic element connected with the pad groups.

In the wiring substrate and the electronic apparatus provided by the embodiments of the present disclosure, the shielding signal line includes second portions which are located between two adjacent pad groups along the second direction, and as a result, the second portions can discharge electrostatic charge accumulated on the sub-pads of the pad groups adjacent to the second portions. Thus, the capability of the shielding signal line to discharge the electrostatic charge is increased, and the problem of electrostatic breakdown between adjacent sub-pads can be improved, so as to increase the product yield of the wiring substrate.

DETAILED DESCRIPTION OF THE EMBODIMENTS

Figure 1:
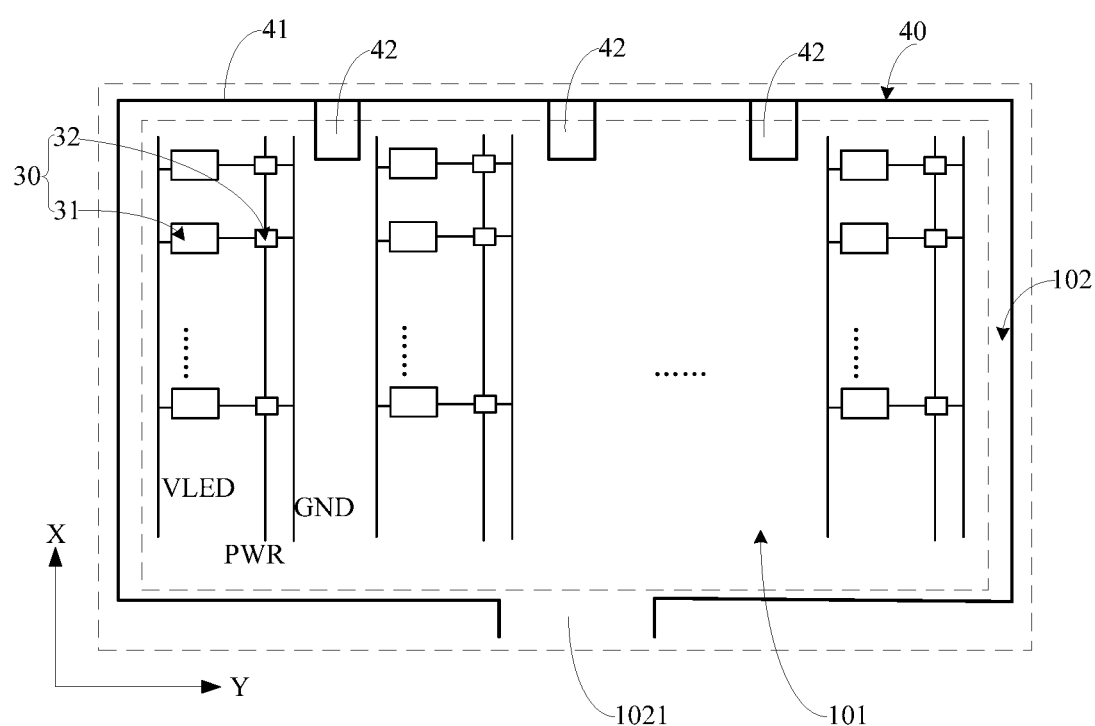
FIG. 1 is a structural schematic diagram illustrating a wiring substrate according to an exemplary embodiment of the present disclosure.

Exemplary embodiments will be described in detail herein, with the illustrations thereof represented in the drawings. When the following descriptions involve the drawings, like numerals in different drawings refer to like or similar elements unless otherwise indicated. The embodiments described in the following examples do not represent all embodiments consistent with the present disclosure. Rather, they are merely examples of apparatuses and methods consistent with some aspects of the present disclosure as detailed in the appended claims.

The terms used in the present disclosure are for the purpose of describing particular examples only, and are not intended to limit the present disclosure. Terms determined by "a", "the" and "said" in their singular forms in the present disclosure and the appended claims are also intended to include plurality, unless clearly indicated otherwise in the context. It should also be understood that the term "and/or" as used herein refers to and includes any and all possible combinations of one or more of the associated listed items.

It is to be understood that, although the terms "first," "second." "third." and the like may be used in the present disclosure to describe various information, such information should not be limited to these terms. These terms are only used to distinguish one category of information from another. For example, without departing from the scope of the present disclosure, first information may be referred as second information; and similarly, the second information may also be referred as the first information. Depending on the context, the term "if" as used herein may be interpreted as "when" or "upon" or "in response to determining".

Embodiments of the present disclosure provide a wiring substrate and an electronic apparatus. The wiring substrate and the electronic apparatus in the embodiments of the present disclosure will be detailed below in combination with accompanying drawings. In case of no conflicts, the features of the following embodiments can be mutually supplemented or combined.

Figure 2:
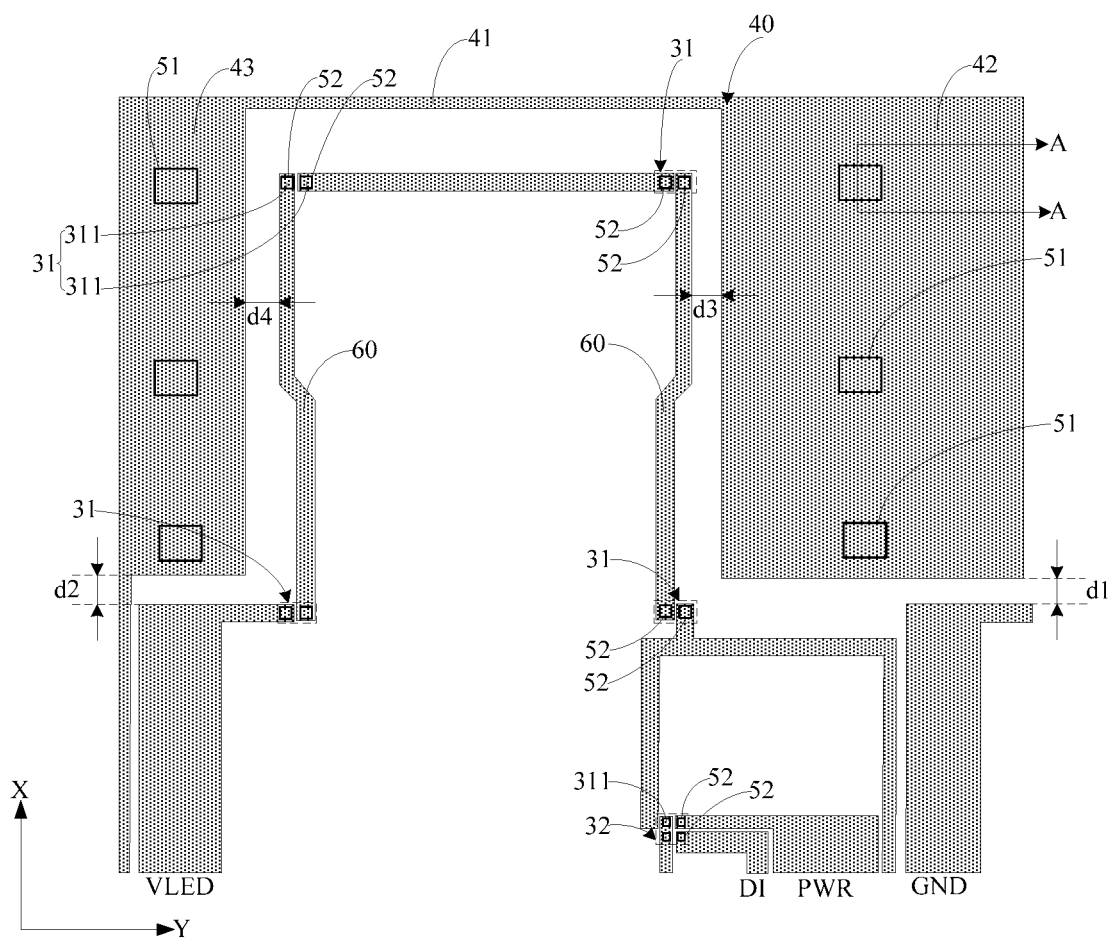
FIG. 2 is a partial structural schematic diagram illustrating a wiring substrate according to an exemplary embodiment of the present disclosure.

An embodiment of the present disclosure provides a wiring substrate. As shown in FIGS. 1 and 2, the wiring substrate includes a substrate and a shielding signal line 40 disposed on the substrate. The substrate includes a functional region 101 where a plurality of pad groups 30 are disposed. The plurality of pad groups 30 are distributed in an array along a first direction X and a second direction Y respectively, where the second direction Y intersects with the first direction X. The shielding signal line 40 includes a first portion 41 surrounding all pad groups 30 and second portions 42 connected with the first portion 41. The second portions 42 are located between two adjacent pad groups 30 along the second direction Y. Each pad group 30 includes a plurality of sub-pads 311.

Figure 3:
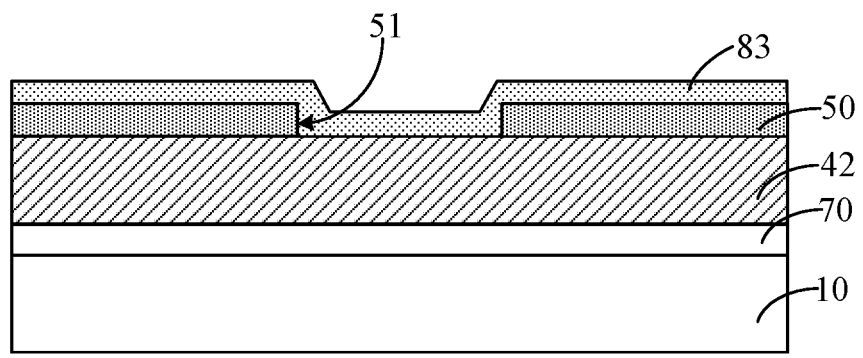
FIG. 3 is a partial sectional view of the wiring substrate in FIG. 2 taken along AA.

In an embodiment, as shown in FIG. 3, the wiring substrate includes an insulation layer 50 located at a side of the shielding signal line 40 away from the substrate 10. The insulation layer 50 may cover most of a region of a conductive layer of the wiring substrate to prevent invasion of water and oxygen and improve the reliability of the wiring substrate.

In some embodiments, the insulation layer 50 includes an inorganic layer which can achieve good blocking for water and oxygen, thus helping improve the reliability of the wiring substrate. In an exemplary embodiment, a material of the insulation layer is an inorganic material which may include at least one of silicon nitride, silicon oxide or silicon oxynitride. The insulation layer 50 may include one inorganic layer or several inorganic layers or a stacked structure including one or more organic layers and one or more inorganic layers.

In an embodiment, as shown in FIG. 2, the insulation layer 50 is provided with a plurality of second holes 52, and one second hole 52 exposes one sub-pad 311. Namely, a region exposed by the second hole 52 and on the conductive layer of the wiring substrate is the sub-pad 311.

During a manufacturing process of an electronic apparatus where the wiring substrate is located, because the process conditions of a previous procedure and a next procedure are different, it is required to transfer the wiring substrate from the previous procedure to the next procedure, which may involve attachment and removal of a protective film in some embodiments. Specifically, after each line film layer is prepared in the wiring substrate, before anti-oxidation treatment by Electroless Nickel Immersion Gold process is performed on the regions where the sub-pads are located, attachment and removal of the protective film may be involved. After anti-oxidation treatment by Electroless Nickel Immersion Gold process is performed on the regions where the sub-pads are located, before a reflective material layer is disposed on the wiring substrate, attachment and removal of the protective film is involved. Since the material of the insulation layer 50 is an inorganic material, electrostatic charge may be injected to the sub-pads 311 of the pad groups 30 during a process of attaching the protective film to the insulation layer 50. The electrostatic charge accumulated on the sub-pads 311 cannot be effectively discharged, which may lead to electrostatic breakdown between adjacent sub-pads 311.

In the wiring substrate provided by the embodiments of the present disclosure, with the configuration of the shielding signal line 40 including the second portions 42 each of which are located between two adjacent pad groups 30 along the second direction Y, the second portions 42 can discharge the electrostatic charge accumulated on the sub-pads 311 of the pad groups 30 adjacent to the second portions 42. In this way, the capability of the shielding signal line 40 to discharge the electrostatic charge can be increased and the problem of electrostatic breakdown between adjacent sub-pads 311 can be solved, thus improving the product yield of the wiring substrate.

In an embodiment, the first direction X is perpendicular to the second direction Y. For example, the first direction X is a column direction and the second direction Y is a row direction.

In an embodiment, the plurality of pad groups 30 disposed in the functional region 101 may be arranged in multiple rows and columns. Each row of pad groups includes a plurality of pad groups 30 arranged in a spacing along the row direction, and each column of pad groups includes a plurality of pad groups 30 arranged in a spacing along the column direction.

In an embodiment, the substrate further includes a frame region 102 which surrounds the functional region 101. The first portion 41 of the shielding signal line 40 may be located in the frame region 102. The frame region 102 may include a bonding region 1021 provided with a flexible circuit board.

In an embodiment, as shown in FIGS. 1 and 2, the wiring substrate further includes a plurality of signal lines disposed on the substrate. The plurality of signal lines include, for example, a common voltage line GND, a drive voltage line VLED, a source power supply line PWR, a source address line DI, etc. Each signal line is electrically connected with the flexible circuit board of the bonding region 1021. The flexible circuit board provides signals for the shielding signal line 40 and the plurality of signal lines, for example, the flexible circuit board may provide a same signal for the common voltage line GND and the shielding signal line 40.

In an embodiment, the sub-pads 311 of the pad groups 30 are soldered to an electronic element. The electronic element may include an inorganic light-emitting diode with a size being at the magnitude of several hundred microns or less, and the electronic element may also include a drive chip with a size being at the magnitude of several hundred microns or less. The inorganic light-emitting diode with a size being at the magnitude of several hundred microns or less may be mini LED, or micro LED. The mini LED has a size of 100 μm to 500 μm, and the micro LED has a size of less than 100 μm. The drive chip may be a chip capable of providing a signal for the inorganic light-emitting diode to enable the inorganic light-emitting diode to emit light.

Figure 4:
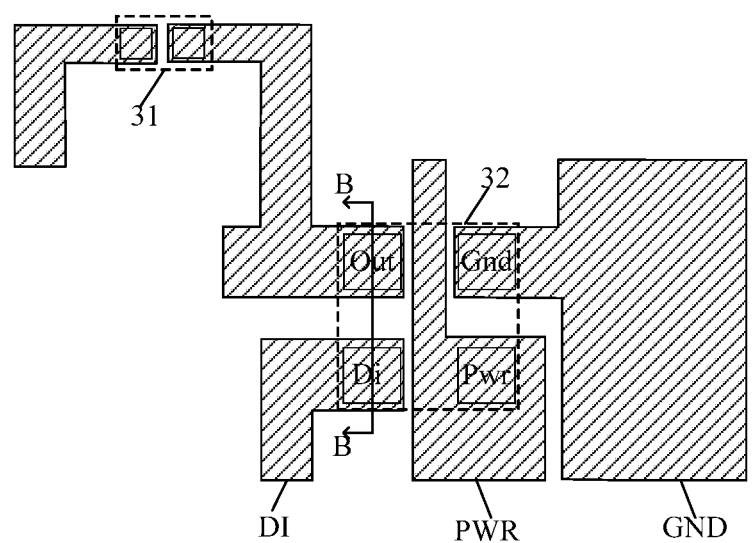
FIG. 4 is a partial structural schematic diagram illustrating an electronic apparatus where a wiring substrate is located according to an exemplary embodiment of the present disclosure.

In some embodiments, as shown in FIGS. 1, 2 and 4, each pad group 30 includes a first sub-pad group 31 and a second sub-pad group 32. The first sub-pad group 31 includes at least two sub-pads 311 which are soldered to the inorganic light-emitting diode. For example, one inorganic light-emitting diode may include two pins corresponding to two sub-pads 311 of the first sub-pad group 31. One of the two sub-pads 311 is an anode pad and the other is a cathode pad. The second sub-pad group 32 includes at least two sub-pads 311 which are configured to be soldered to the drive chip. As shown in FIG. 4, one drive chip includes four pins, and the second sub-pad group 32 corresponding to the drive chip includes four sub-pads, respectively an address pad Di, a power supply pad Pwr, a common voltage pad Gnd and an output pad Out. In a same pad group, the output pad Out of the second sub-pad group 32 is at least connected to a sub-pad 311 of a first sub-pad group 31: the common voltage pad Gnd of the second sub-pad group 32 is connected with a common voltage line GND to receive a common voltage (e.g. grounding voltage) transmitted by the common voltage line GND: the power supply pad Pwr of the second sub-pad group 32 is connected with the source power supply line PWR. The drive voltage line VLED is connected with a sub-pad 311 of a first sub-pad group 31. The source address line DI is connected with the address pads Di soldered to a first-level drive chip in each column of pad groups to transmit an address signal to the first-level drive chip soldered to each column of pad groups.

In an embodiment, a pad group 30 may include four first sub-pad groups 31 and one second sub-pad group 32, namely, four inorganic light-emitting diodes may be driven by one drive chip. As shown in FIG. 2, in the four first sub-pad groups 31, the first sub-pad group 31 electrically connected with the drive voltage line VLED is taken as a start point of the four first sub-pad groups 31 connected in series, and the first sub-pad group 31 electrically connected with the second sub-pad group 32 is taken as an ending point of the four inorganic light-emitting diodes connected in series. It should be noted that, in the embodiments of the present disclosure, the number of the first sub-pad groups 31 of each pad group 30 is not limited to four but may be 5, 6, 7, or 8 or the like.

In an embodiment, the wiring substrate further includes connection wires and at least two sub-pads in a same pad group are connected with the connection wire. For example, the sub-pads 311 of adjacent first sub-pad groups 31 in a same pad group 30 are series-connected by the connection wire 60.

In an embodiment, the shielding signal line 40, the sub-pads 311 of the pad groups 30 and the plurality of signal lines are located in a same layer. In other words, a single-layer conducting layer may be used to manufacture a plurality of sub-pads and traces for connecting adjacent sub-pads and may also be used to manufacture a plurality of signal lines to transmit corresponding electrical signals to the drive chip soldered to the sub-pads of the second sub-pad group and the inorganic light-emitting diode soldered to the sub-pads of the first sub-pad group, thereby helping to simplify the structure of the film layer of the wiring substrate and lower the preparation costs. In the present disclosure, the term "A and B are located in a same layer" refers to that A and B are located on a surface of a same film layer and in direct contact with the surface. In some embodiments, A and B are formed by a same film layer in a same process. In some embodiments, A and B have a basically same height or thickness as well as being located on a surface of a same film layer and in direct contact with the surface.

Figure 5:
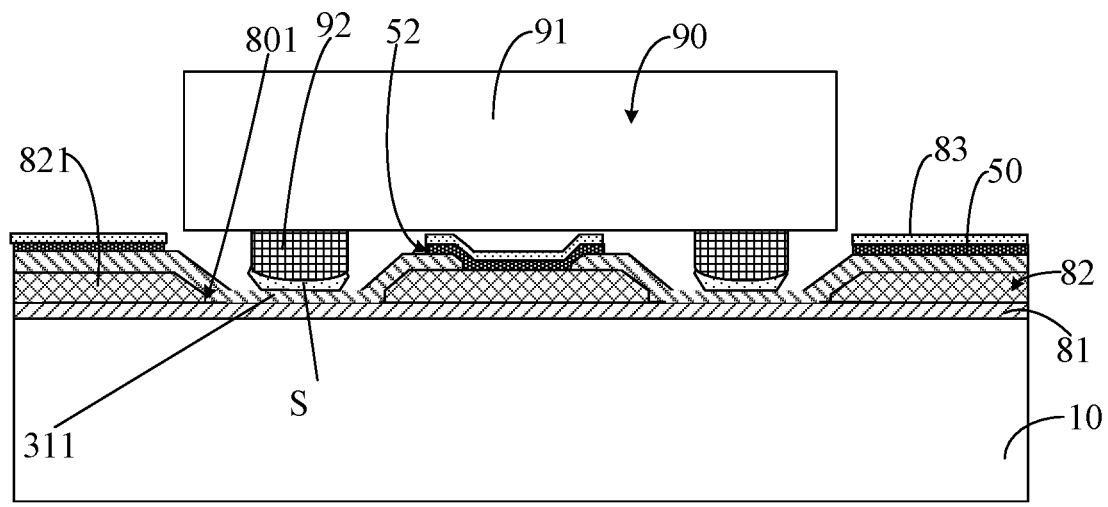
FIG. 5 is a partial structural sectional view of the wiring substrate of the electronic apparatus shown in FIG. 4 taken along BB.

In an embodiment, as shown in FIG. 5, the wiring substrate further includes an insulation material layer 82 between the substrate 10 and the sub-pads 311. The insulation material layer 82 is provided with a plurality of third holes 801, and each sub-pad 311 is at least partially located in a third hole 801. An orthographic projection of each third hole 801 on the substrate 10 falls within an orthographic projection of one second hole 52 on the substrate 10. The sub-pad 311 is at least partially located in the third hole 801, which means at least part of the sub-pad 311 is recessed downward in the third hole 801. The orthographic projection of the third holes 801 on the substrate 10 falls within the orthographic projection of the second holes 52 on the substrate 10, such that the sub-pads 311 are exposed out of the insulation layer 50. The electronic element 90 includes an electronic element body 91 and pins 92 located at a side of the electronic element body 91. When the pins 92 of the electronic element 90 are soldered to the sub-pads 311, a solder wrapped on a surface of the pins 92 is melted and then flows to the third holes 801 so as to drive the pins 92 to move toward the sub-pads 311 to be soldered to the pins 92. The movement of the pins 92 toward the sub-pads 311 improves an offset of the electronic element relative to its soldering position, such that the pins 92 and the corresponding sub-pads 311 can be effectively soldered, thus avoiding the problem of false solder occurring between the pins 92 and the sub-pads 311 due to the offset of the electronic element, and increasing the product yield.

In an embodiment, as shown in FIG. 5, the insulation material layer 82 includes a first organic layer 821.

Furthermore, the first organic layer 821 has a thickness of 2 μm to 4 μm. With this disposal, ease of implementation of the process can be guaranteed and excessive thickness of the first organic layer 821 which further leads to excessive thickness of a wiring substrate can also be avoided. In some embodiments, the thickness of the first organic layer 821 may be, for example, 2 μm, 2.5 μm, 3 μm, 3.5 μm or 4 μm or the like.

In an embodiment, as shown in FIG. 5, the wiring substrate may further include a passivation protective layer 81 between the substrate 10 and the insulation material layer 82, and the passivation protective layer 81 may be in direct contact with the substrate 10. The passivation protective layer 81 can protect the substrate 10 against damage caused by etching the film layer above the substrate 10. A material of the passivation protective layer 81 may be an inorganic material, for example, silicon nitride, silicon oxide or silicon oxynitride. In an embodiment, as shown in FIG. 1, the second portions 42 are located between two pad groups 30 adjacent to each other along the second direction Y and farthest from the bonding region 1021 in a plurality of pad groups 30 arranged along the first direction X. An area of the conductive layer for discharging electrostatic charge near the pad groups 30 farthest from the bonding region 1021 in the plurality of pad groups 30 arranged in the first direction X is smaller, which leads to the problem of easier occurrence of electrostatic breakdown between adjacent sub-pads 311. For this problem, disposing the second portions 42 between two adjacent pad groups 30 of these pad groups 30 can effectively improve the problem of electrostatic breakdown of the sub-pads 311 of the these pad groups 30 caused by electrostatic charge accumulated.

In some embodiments, as shown in FIG. 1, in one row of pad groups 30 farthest from the bonding region 1021 in a plurality of pad groups 30 arranged in the first direction X, the second portion 42 is disposed between any two adjacent pad groups 30. This disposal is more helpful to improving the problem of electrostatic breakdown of the sub-pads 311 of the pad groups 30 farthest from the bonding region 1021 in the wiring substrate due to electrostatic charge accumulated.

In an embodiment, the first portion 41 and the second portions 42 are formed into an integral structure.

In an embodiment, a line width of the first portion 41 is less than a size of the second portions 42 along the first direction. The first portion 41 includes a first segment extending along the first direction X and a second segment extending along the second direction Y. The line width of the first segment refers to a width of the first segment along the second direction Y, and the line width of the second segment refers to a width of the second segment along the first direction X. By setting the size of the second portions 42 along the first direction X to be greater than the line width of the first portion 41, the area of the second portions 42 is made larger such that the second portions 42 can discharge a larger amount of electrostatic charge accumulated on the adjacent sub-pads 311. Further, an impedance of the shielding signal line 40 can be reduced, and the capability of the shielding signal line 40 to discharge electrostatic charge can be increased, helping to improve the problem of electrostatic breakdown of the sub-pads 311 in the wiring substrate due to electrostatic charge accumulated.

In an embodiment, as shown in FIGS. 2 and 3, the insulation layer 50 is provided with a plurality of first holes 51, and an orthographic projection of one second portion 42 on the substrate covers an orthographic projection of at least one first hole 51 on the substrate 10. That is, a partial region of the second portion 42 is exposed by the first hole 51. With this disposal, a part of electrostatic charge introduced during attaching the protective film may be dispersed to the regions exposed by the first holes 51 in the second portions 42, and hence, a smaller amount of electrostatic charge will be injected to the sub-pads 311 adjacent to the second portions 42, which further improves the problem of the electrostatic breakdown of the sub-pads 311 in the wiring substrate due to electrostatic charge accumulated. The first holes 51 may be in the shape of rectangle, square or circle or the like.

In an embodiment, as shown in FIG. 2, the area of the first holes 51 is greater than the area of the second holes 52. In this disposal, the electrostatic charge introduced during attaching the protective film is more easily injected to the first holes 51 with larger area, helping to reduce the amount of the electrostatic charge injected to the sub-pads 311 adjacent to the second portions 42.

In an embodiment, as shown in FIG. 2, the orthographic projection of one second portion 42 on the substrate covers the orthographic projection of at least two first holes 51 on the substrate and the at least two first holes 51 are arranged in a spacing along the first direction X. In this disposal, the first holes 51 corresponding to the second portions 42 are well dispersed along the first direction X, such that the electrostatic charge introduced to the sub-pads 311 adjacent to the second portions 42 at the time of attaching the protective film is dispersed by the second portions 42 in a larger amount.

In an embodiment, a total area of the first holes 51 corresponding to one second portion 42 is greater than a total area of the second holes 52 corresponding to one pad group 30 adjacent to the second portion 42. The orthographic projection of the second portion 42 on the substrate covers the orthographic projection of the first holes 51 corresponding to the second portion 42 on the substrate. With this disposal, most of the electrostatic charge introduced during attaching the protective film is injected to the regions of the second portions 42 exposed by the first holes 51 and discharged by the shielding signal line, so as to effectively reduce the amount of the electrostatic charge injected to the sub-pads 311 adjacent to the second portions 42.

In an embodiment, as shown in FIG. 2, the shielding signal line 40 further includes third portions 43 connected with the first portion 41. The third portions 43 are disposed at a side, not adjacent to other pad groups 30 along the second direction Y, of the pad groups 30 located at corners of the functional region 101. The pad groups 30 at the corners refer to that no other pad groups 30 are disposed between the pad groups 30 and the first segment of the first portion 41 extending along the first direction X, and no other pad groups 30 are disposed between the pad groups 30 and the second segment away from the bonding region 1021. The third portions 43 can discharge the electrostatic charge accumulated on the pad groups 30 at the corners, so as to improve the problem of electrostatic breakdown of adjacent sub-pads 311 in the pad groups 30.

In an embodiment, the shielding signal line 40 may include two opposed third portions 43 which are located at the opposed sides of the functional region 101.

In an embodiment, the first portion 41 and the third portions 43 are formed into an integral structure.

In an embodiment, the line width of the first portion 41 is less than a size of the third portions 43 along the first direction X. With this disposal, the third portions 43 will have a larger area and thus the third portions 43 can discharge a larger amount of electrostatic charge accumulated on the adjacent sub-pads 311. Further, the impedance of the shielding signal line 40 can be reduced, and the capability of the shielding signal line 40 to discharge the electrostatic charge is increased, which is more helpful to improving the problem of the electrostatic breakdown of the sub-pads 311 in the wiring substrate due to electrostatic charge accumulated. Furthermore, the line width of the first portion 41 is less than the size of the third portions 43 along the second direction Y so as to further increase the area of the third portions 43.

In an embodiment, the size of the third portions 43 along the second direction Y is less than the size of the second portions 42 along the second direction Y. In this case, the third portions 43 occupy less space along the second direction Y and thus the disposal of the third portions 43 has less impact on the size of the wiring substrate along the second direction Y.

In an embodiment, an orthographic projection of one third portion 43 on the substrate covers the orthographic projection of at least one first hole 51 on the substrate. That is, a partial region of the third portion 43 is exposed by the first hole 51. In this case, a part of the electrostatic charge introduced by attaching the protective film can be dispersed to the region of the third portion 43 exposed by the first hole 51. As a result, a smaller amount of electrostatic charge will be injected to the sub-pads 311 adjacent to the third portions 43, and the problem of the electrostatic breakdown of the sub-pads 311 in the wiring substrate can be further improved due to the electrostatic charge accumulated.

In an embodiment, the orthographic projection of one third portion 43 on the substrate covers the orthographic projection of at least two first holes 51 on the substrate. The at least two first holes 51 are arranged in a spacing along the first direction X. In this case, the first holes 51 corresponding to the third portions 43 are well dispersed along the first direction X, and thus the electrostatic charge introduced to the sub-pads 311 adjacent to the third portions 43 at the time of attaching the protective film can be discharged by the third portions 43 in a larger amount.

In an embodiment, a total area of the first holes 51 corresponding to one third portion 43 is greater than a total area of the second holes 52 corresponding to one pad group 30 adjacent to the third portion 43. The orthographic projection of the third portions 43 on the substrate covers the orthographic projection of the first holes 51 corresponding to the third portions 43 on the substrate. In this case, most of the electrostatic charge introduced by attaching the protective film is injected to the regions of the third portions 43 exposed by the first holes 51 and discharged by the shielding signal line, so as to effectively reduce the amount of the electrostatic charge injected to the sub-pads 311 adjacent to the third portions 43.

In an embodiment, in a plurality of second holes 52 corresponding to the pad groups 30 farthest from the bonding region 1021 in a plurality of pad groups 30 arranged along the first direction X, a distance from the second hole 52 closest to the bonding region 1021 to the bonding region 1021 is referred to as a first distance, a distance from an edge of the second portions 42 facing toward the bonding region 1021 to the bonding region 1021 is referred to as a second distance, and a distance from an edge of the third portions 43 facing toward the bonding region 1021 to the bonding region 1021 is referred to as a third distance.

In some embodiments, the second distance is greater than or equal to the first distance. In this case, the second portions 42 do not go beyond the sub-pads 311 of the pad groups adjacent to the second portions 42 along the first direction X. The disposal of the second portions 42 will not affect the arrangement of signal lines at a side, facing toward the bonding region 1021, of the pad groups 30 adjacent to the second portions 42.

In some embodiments, the third distance is greater than or equal to the first distance. In this case, the third portions 43 do not go beyond the sub-pads 311 of the pad groups adjacent to the third portions 43 along the first direction X. The disposal of the third portions 43 will not affect the arrangement of signal lines at a side, facing toward the bonding region 1021, of the pad groups 30 adjacent to the third portions 43.

In an embodiment, in a plurality of signal lines of the wiring substrate, at least one signal line is located at a side of the second portions 42 facing toward the bonding region 1021. Along the first direction X, a distance between the second portions 42 and the signal line at a side of the second portions 42 facing toward the bonding region 1021 is greater than or equal to 200 microns. The distance between the second portions 42 and the signal line at a side of the second portions 42 facing toward the bonding region 1021 refers to a minimum distance between the second portions 42 and the signal line at a side of the second portions 42 facing toward the bonding region 1021. As shown in FIG. 2, the signal line at a side of the second portions 42 facing toward the bonding region 1021 includes a common voltage line GND, a source power supply line PWR and a source address line DI and the like, where the distance between the common voltage line GND and the second portions 42 is minimal. The distance between the second portions 42 and the common voltage line GND at a side of the second portions 42 facing toward the bonding region 1021 is d1, which is greater than or equal to 200 microns. In this case, the problem of signal crosstalk generated due to excessively small distance between the second portions 42 and the signal line at a side of the second portions 42 facing toward the bonding region 1021 can be avoided.

In an embodiment, in a plurality of signal lines of the wiring substrate, at least one signal line is located at a side of the third portions 43 facing toward the bonding region 1021. Along the first direction X, a distance between the third portions 43 and the signal line at a side of the third portions 43 facing toward the bonding region 1021 is greater than or equal to 200 microns. The distance between the third portions 43 and the signal line at a side of the third portions 43 facing toward the bonding region 1021 refers to a minimum distance between the third portions 43 and the signal line at a side of the third portions 43 facing toward the bonding region 1021. As shown in FIG. 2, the signal line at a side of the third portions 43 facing toward the bonding region 1021 includes a drive voltage line VLED, and a distance between the drive voltage line VLED and the third portions 43 is d2 which is greater than or equal to 200 microns. In this case, the problem of signal crosstalk generated due to excessively small distance between the third portions 43 and the signal line at a side of the third portions 43 facing toward the bonding region 1021 can be avoided.

In an embodiment, at least two sub-pads 311 in a same pad group 30 are connected by a connection wire 60. Along the second direction Y, a minimum distance between the second portions 42 and the adjacent connection wires 60 is greater than or equal to 200 microns. As shown in FIG. 2, along the second direction Y, the minimum distance between the second portions 42 and the adjacent connection wires 60 is d3 which is greater than or equal to 200 microns. In this case, signal crosstalk generated between the second portions 42 and the adjacent connection wires 60 can be avoided.

In an embodiment, along the second direction Y, a minimum distance between the third portions 43 and the adjacent connection wires 60 is greater than or equal to 200 microns. As shown in FIG. 2, along the second direction Y, the minimum distance between the third portions 43 and the adjacent connection wires 60 is d4 which is greater than or equal to 200 microns. In this case, signal crosstalk generated between the third portions 43 and the adjacent connection wires 60 can be avoided.

In an embodiment, the wiring substrate further includes a reflective material layer 83 disposed at a side of the insulation layer 50 away from the substrate 10, where the reflective material layer 83 covers the first holes 51. The reflective material layer 83 is provided with an opening by which the inorganic light-emitting diode soldered to the first sub-pad group is exposed. The disposal of the reflective material layer can increase an amount of light emitted by the inorganic light-emitting diode. The reflective material layer covers the first holes 51 to prevent the shielding signal line 40 from being corroded due to invasion of water oxygen into the shielding signal line 40 through the first holes 51, helping increase the reliability of the wiring substrate. In some embodiments, a material of the reflective material layer may be a white ink, the components of which include a resin (e.g. epoxy resin, polytetrafluoroethylene resin), titanium dioxide (chemical formula: $TiO_2$) and an organic solvent (e.g. dipropylene glycol methyl ether) and the like.

In an embodiment, as shown in FIG. 3, the wiring substrate further includes a stress matching layer 70 located between the substrate 10 and the shielding signal line 40 as well as various signal lines. The stress matching layer 70 can reduce a stress difference between the substrate 10 and the shielding signal line 40 as well as various signal lines to prevent warping of the film layer. A material of the stress matching layer 70 may be silicon nitride, silicon oxide or silicon oxynitride.

An embodiment of the present disclosure further provides an electronic apparatus. The electronic apparatus includes the wring substrate as described in any one of the above embodiments and the electronic element connected with the pad groups. Specifically, in a die bonding process, the pins of the electronic element may be bonded to the sub-pads through soldering metals S respectively. Next, in a reflow soldering process, the pins of the electronic element are fixedly connected to the sub-pads respectively.

In an embodiment, the electronic element may include an inorganic light-emitting diode with a size being at the magnitude of several hundred microns or less and the electronic element may also include a drive chip with a size being at the magnitude of several hundred microns or less. The inorganic light-emitting diode with a size being at the magnitude of several hundred microns or less may be mini LED, or micro LED. The mini LED has a size of 100 µm to 500 µm, and the micro LED has a size of less than 100 µm. The drive chip may be a chip capable of providing a signal for the inorganic light-emitting diode to enable the inorganic light-emitting diode to emit light.

In some embodiments, each pad group 30 includes a first sub-pad group 31 and a second sub-pad group 32. Sub-pads 311 of the first sub-pad group 31 are soldered to the inorganic light-emitting diode. Sub-pads 311 of the second sub-pad group 32 are soldered to the drive chip.

In an embodiment, the electronic apparatus may be used as backlight source of a liquid crystal display panel.

In another embodiment, the electronic apparatus may be a liquid crystal display apparatus. The liquid crystal display apparatus further includes a liquid crystal panel located at a side of the electronic element away from the substrate. The liquid crystal display apparatus may have more uniform backlight brightness and better display contrast.

In another embodiment, when the electronic apparatus is used as a display apparatus, each inorganic light-emitting diode serves as one sub-pixel.

In the present disclosure, the display apparatus is not limited herein and may be a television, a laptop computer, a tablet computer, a wearable display device, a mobile phone, a vehicle-mounted display device, a navigation device, an electronic book, a digital photo frame, an advertising lamp box or other products or components having a display function.

It should be noted that in the accompanying drawings, for illustration clarity, the sizes of the layers and regions may be exaggerated. Furthermore, it may be understood that when an element or layer is referred to as being "on" another element or layer, such element or layer may be directly on the another element or layer or there is an intermediate layer therebetween. Further, it is understood that when an element or layer is referred to as being "under" another element or layer, such element or layer may be directly under the another element or layer, or one or more intermediate elements or layers are present therebetween. In addition, it may also be understood that when a layer or element is referred to as being between two layers or elements, such layer or element may be a sole layer between the two layers or elements, or one or more intermediate layers or elements are present. Like reference signs in the descriptions indicate like elements.

Other implementations of the present disclosure will be apparent to those skilled in the art from consideration of the specification and practice of the present disclosure herein. The present disclosure is intended to cover any variations, uses, modification or adaptations of the present disclosure that follow the general principles thereof and include common knowledge or conventional technical means in the related art that are not disclosed in the present disclosure. The specification and examples are considered as exemplary only, with a true scope and spirit of the present disclosure being indicated by the following claims.

It is to be understood that the present disclosure is not limited to the precise structure described above and shown in the accompanying drawings, and that various modifications and changes may be made without departing from the scope thereof. The scope of the present disclosure is limited only by the appended claims.

The invention claimed is:

1. A wiring substrate, comprising a substrate, and a shielding signal line disposed on the substrate; wherein,
the substrate comprises a functional region; the functional region is provided with a plurality of pad groups; the plurality of pad groups are distributed in an array along a first direction and a second direction respectively, and the second direction intersects with the first direction; and
the shielding signal line comprises a first portion surrounding all the pad groups and second portions protruding from the first portion in the first direction, wherein the second portions each are located between two adjacent pad groups along the second direction,
wherein the wiring substrate further comprises a bonding region at a side of the functional region, and the second portions each are located between two pad groups adjacent to each other along the second direction and farthest from the bonding region in a plurality of pad groups arranged along the first direction, and
wherein in the second direction, at least a part of each of the second portions overlaps with the two pad groups; and a distance, in the first direction, from an edge of the second portions facing toward the bonding region in the first direction to the bonding region is greater than a distance, in the first direction, from a side of each of the two pad groups close to the bonding region in the first direction to the bonding region.

2. The wiring substrate of claim 1, wherein the first portion and the second portions are formed into an integral structure.

3. The wiring substrate of claim 1, wherein a line width of the first portion is less than a size of the second portions along the first direction.

4. The wiring substrate of claim 1, further comprising an insulation layer located at a side of the shielding signal line away from the substrate, wherein the insulation layer is provided with a plurality of first holes, and an orthographic projection of one second portion on the substrate covers an orthographic projection of at least one first hole on the substrate.

5. The wiring substrate of claim 4, wherein the orthographic projection of one second portion on the substrate covers an orthographic projection of at least two first holes on the substrate, and the at least two first holes are arranged in a spacing along the first direction.

6. The wiring substrate of claim 4, wherein each of the pad groups comprises at least two sub-pads; the insulation layer is further provided with a plurality of second holes, and one second hole exposes one sub-pad; a total area of the first holes corresponding to one second portion is greater than a total area of the second holes corresponding to one pad group adjacent to the second portion.

7. The wiring substrate of claim 4, wherein the insulation layer comprises an inorganic layer.

8. The wiring substrate of claim 4, further comprising a reflective material layer located at a side of the insulation layer away from the substrate, wherein the reflective material layer covers the first holes.

9. The wiring substrate of claim 1, wherein the shielding signal line further comprises third portions connected with the first portion;
the third portions are disposed at a side, not adjacent to other pad groups along the second direction, of the pad groups at corners of the functional region.

10. The wiring substrate of claim 9, wherein the first portion and the third portions are formed into an integral structure.

11. The wiring substrate of claim 9, wherein a line width of the first portion is less than a size of the third portions along the first direction; and/or, a size of the third portions along the second direction is less than a size of the second portions along the second direction.

12. The wiring substrate of claim 9, further comprising an insulation layer located at a side of the shielding signal line away from the substrate, wherein the insulation layer is provided with a plurality of first holes, and an orthographic projection of one third portion on the substrate covers an orthographic projection of at least one first hole on the substrate.

13. The wiring substrate of claim 12, wherein the orthographic projection of one third portion on the substrate covers an orthographic projection of at least two first holes on the substrate; and the at least two first holes are arranged in a spacing along the first direction.

14. The wiring substrate of claim 12, wherein each of the pad groups comprises at least two sub-pads; and the insulation layer is further provided with a plurality of second holes, and one second hole exposes one sub-pad;
a total area of the first holes corresponding to one third portion is greater than a total area of the second holes corresponding to one pad group adjacent to the third portion.

15. The wiring substrate of claim 14, wherein, in a plurality of second holes corresponding to pad groups farthest from the bonding region in the plurality of pad groups arranged along the first direction, a distance from the second hole closest to the bonding region to the bonding region is a first distance, the distance from the edge of the second portions facing toward the bonding region in the first direction to the bonding region is a second distance, and a distance from an edge of the third portions facing toward the bonding region to the bonding region is a third distance;
the second distance is greater than or equal to the first distance; and/or the third distance is greater than or equal to the first distance.

16. The wiring substrate of claim 9, further comprising a plurality of signal lines disposed on the substrate; wherein,
in the plurality of signal lines, at least one signal line is located at a side of the second portions facing toward the bonding region; along the first direction, a distance between the second portions and the at least one signal line at the side of the second portions facing toward the bonding region is greater than or equal to 200 microns;
and/or, in the plurality of signal lines, at least one signal line is located at a side of the third portions facing toward the bonding region; along the first direction, a distance between the third portions and the at least one signal line at the side of the third portions facing toward the bonding region is greater than or equal to 200 microns.

17. The wiring substrate of claim 9, wherein each of the pad groups comprises a plurality of sub-pads, the wiring substrate further comprises connection wires, and at least two sub-pads in a same pad group are connected by the connection wire; along the second direction, a minimum distance between the second portions and the adjacent connection wires is greater than or equal to 200 microns; and/or, along the second direction, a minimum distance between the third portions and the adjacent connection wires is greater than or equal to 200 microns.

18. The wiring substrate of claim 1, wherein each of the pad groups comprises a plurality of sub-pads, and the plurality of sub-pads and the shielding signal line are disposed in a same layer.

19. The wiring substrate of claim 1, wherein each of the pad groups comprises a plurality of first sub-pad groups and one second sub-pad group, the plurality of first sub-pad groups are electrically connected with each other in series by a connection wire, at least one sub-pad of the second sub-pad group is connected to one sub-pad of a corresponding first sub-pad group of the plurality of first sub-pad groups, the plurality of first sub-pad groups are configured to be soldered to a plurality of inorganic light-emitting diodes respectively, and the second sub-pad group is configured to be soldered to a drive chip.

20. An electronic apparatus, comprising
a wiring substrate comprising:
    a substrate and a shielding signal line disposed on the substrate; wherein
    the substrate comprises a functional region; the functional region is provided with a plurality of pad groups; the plurality of pad groups are distributed in an array along a first direction and a second direction respectively, and the second direction intersects with the first direction; and
    the shielding signal line comprises a first portion surrounding all the pad groups and second portions protruding from the first portion in the first direction, wherein the second portions each are located between two adjacent pad groups along the second direction;
and an electronic element connected with the pad groups,
wherein the wiring substrate further comprises a bonding region at a side of the functional region, and the second portions each are located between two pad groups adjacent to each other along the second direction and farthest from the bonding region in a plurality of pad groups arranged along the first direction, and
wherein in the second direction, at least a part of each of the second portions overlaps with the two pad groups; and a distance, in the first direction, from an edge of the second portions facing toward the bonding region in the first direction to the bonding region is greater than a distance, in the first direction, from a side of each of the two pad groups close to the bonding region in the first direction to the bonding region.

* * * * *